United States Patent
Hogommat-Chabrot et al.

(10) Patent No.: US 11,848,813 B2
(45) Date of Patent: Dec. 19, 2023

(54) RADIO TRANSMISSION DEVICE FOR THE RADIO TRANSMISSION OF AN INTERROGATION SIGNAL BASED ON A SIGNAL TO BE AMPLIFIED

(71) Applicant: THALES, Courbevoie (FR)

(72) Inventors: Laure Hogommat-Chabrot, Laval (FR); Jean-René Gely, Gennevilliers (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/558,245

(22) Filed: Dec. 21, 2021

(65) Prior Publication Data

US 2022/0200836 A1  Jun. 23, 2022

(30) Foreign Application Priority Data

Dec. 23, 2020  (FR) .................................... 2013991

(51) Int. Cl.
| | | |
|---|---|---|
| *H04L 27/36* | (2006.01) | |
| *G08G 5/04* | (2006.01) | |
| *H03K 4/94* | (2006.01) | |
| *H04B 1/59* | (2006.01) | |

(52) U.S. Cl.
CPC ............. *H04L 27/367* (2013.01); *G08G 5/04* (2013.01); *H03K 4/94* (2013.01); *H04B 1/59* (2013.01)

(58) Field of Classification Search
CPC ...... G01S 13/782; G01S 13/872; G01S 13/91; G01S 7/032; G01S 7/282; G08G 5/04; H03K 4/94; H04B 1/59; H04L 27/367
See application file for complete search history.

(56) References Cited

U.S. PATENT DOCUMENTS

| | | | | |
|---|---|---|---|---|
| 3,927,404 A | * | 12/1975 | Cooper ................ | G08B 26/002 340/533 |
| 7,787,564 B1 | * | 8/2010 | Anvari ................ | H04L 27/2614 330/136 |
| 2005/0156777 A1 | | 7/2005 | King et al. | |
| 2010/0136903 A1 | * | 6/2010 | Lee ................... | H04L 25/03343 455/17 |

FOREIGN PATENT DOCUMENTS

| | | | | |
|---|---|---|---|---|
| CA | 2988337 A1 | * | 6/2018 | ............... G01S 7/32 |
| EP | 3 337 045 A1 | | 6/2018 | |

OTHER PUBLICATIONS

Tactical Operations Committee (TOC) Meeting Summary, RTCA Paper No. 077-18, TOC 040, Mar. 1, 2018, online: https://www.rtca.org/wp-content/uploads/2020/08/summary_mar_1_2018_toc_mtg_with_attch.pdf (Year: 2018).*

* cited by examiner

*Primary Examiner* — Nader Bolourchi
(74) *Attorney, Agent, or Firm* — BakerHostetler

(57) ABSTRACT

A radio transmission device for the radio transmission of an interrogation signal based on a signal to be amplified is provided. This method comprises a generator for generating a signal to be amplified, and a selection block for selecting a type of interrogation signal to be transmitted from among at least two different types of signals. The generator for generating a signal to be amplified is configured so as to allow transmission of the signal to be amplified so as to generate the interrogation signal corresponding to the selected type of interrogation signal.

11 Claims, 2 Drawing Sheets

RADIO TRANSMISSION DEVICE FOR THE RADIO TRANSMISSION OF AN INTERROGATION SIGNAL BASED ON A SIGNAL TO BE AMPLIFIED

CROSS-REFERENCE TO RELATED APPLICATIONS

This application claims priority to foreign French patent application No. FR 2013991, filed on Dec. 23, 2020, the disclosure of which is incorporated by reference in its entirety.

FIELD OF THE INVENTION

The present invention lies in the field of pulsed RF (acronym for radiofrequency) transmissions, and relates more precisely to controlling the transmission spectrum of such modulations. It applies in particular to pulsed modulations used in the context of IFF (for "Identification Friend or Foe") communications.

BACKGROUND

IFF transmissions are transmissions used in aeronautics in the frequency range [1030 MHz-1090 MHz] to allow approach radars, both civilian and military, to recognize "friendly" aircraft and to determine their heading and their distance. IFF transmissions are based on trains of pulses transmitted at a high power. IFF communications may be implemented using various modes (civilian in accordance with ICAO (for "International Civil Aviation Organization") Annex 10, and military in accordance with STANAG (for "NATO Standardization Agreements") 4193), and differ depending on whether interrogation mode or response mode is currently being used. The information is transmitted by varying the width of the pulses, their relative spacings, and/or by introducing a modulation layer into the pulses (typically a DPSK (for "Differential Phase Shift Keying") modulation or an MSK (for "Minimum Shift Keying") modulation). The widths of the pulses and the spacings between pulses are typically of the order of a few hundred nanoseconds.

IFF transmissions are subject to significant constraints, defined, inter alia, by AIMS 03-1000b (for "Air traffic control radar beacon system Identification friend or foe", Mark XII/XIIA System from the US Department of Defense), ICAO Annex 10 Volume IV, EUROCAE ED-73F (for EUROpean Organisation for Civil Aviation Equipment), or standard DO260C from the RTCA (for "Radio Technical Commission for Aeronautics"), such as RTCA DO-386 and RTCA DO181F (Mode S) compatible with the airborne collision avoidance system X (ACAS-X). These standards define, inter alia, the spectral and temporal masks that pulses of IFF transmissions have to comply with.

Document EP3337045 discloses a radio transmission device for the radio transmission of a signal transmitted in the form of a sequence of pulses. This device comprises a generation part for generating the pulses on a carrier frequency and an analogue chain for amplifying the pulses before they are transmitted. This amplification chain comprises a plurality of successive amplification stages. This device comprises a generation module for generating a substantially trapezoidal command signal. This command signal is applied as bias voltage for biasing an amplifier of a stage of the amplification chain for each of the pulses. It is thus possible to control the spectral mask of the transmitted pulsed signal by modulating the bias of one of the amplifiers of the amplification chain. This control technique is called "pulse shaping". It notably replaces the bandpass filter, which exhibits numerous drawbacks in terms of performance (no in-band filtering, worsening of the EVM (for "Error Vector Magnitude"), and temperature dispersion), in terms of consumption (increase in power of the chain to compensate for losses), in terms of reliability (impact of the "return loss out band" on the transistors and difficulty in implementing the filter) and in terms of cost (expensive components). Pulse shaping advantageously makes it possible to address these problems, but is applied at present only to single-frequency chains.

Therefore, if it is desired to deliver two different types of signals, for example, a signal at 1090 MHz for a Mode S transponder function or a signal at 1030 MHz for a TCAS function, it is necessary to implement two separate transmission chains. "Mode S transponder" is understood to mean an interrogation mode used to obtain a certain amount of information about aircraft equipped with the system. "TCAS" (for "Traffic Alert and Collision Avoidance System") is understood to mean an interrogation-based and cooperative system that queries the transponders of aircraft close to the frequency 1030 MHz. The Mode S transponder function and the TCAS function thus make it possible to deliver interrogation signals. However, each of these transmission chains has its own weight and volume. The combination of these two transmission chains may then be incompatible in small aircraft. Furthermore, consumption is not optimized, this being a major drawback for drone applications.

There is therefore a need to propose a radio transmission device for the radio transmission of an interrogation signal that is able to transmit various types of signals on various frequencies compatible with the current standards regarding IFF communications.

SUMMARY OF THE INVENTION

The present invention aims to at least partially rectify this need.

More particularly, the present invention aims to improve the bulk of a radio transmission device for the radio transmission of an interrogation signal, while still making it compatible with the transmission of various types of interrogation signals.

A first subject of the invention relates to a radio transmission device for the radio transmission of an interrogation signal based on a signal to be amplified, said interrogation signal comprising a plurality of pulses. The radio transmission device comprises a generator for generating a signal to be amplified, a power amplification chain for amplifying the power of the signal to be amplified so as to form an interrogation signal, and an interface module designed to generate a trapezoidal signal applied as bias voltage in the power amplification chain so as to transmit each of the pulses of said interrogation signal. The radio transmission device comprises a selection block for selecting a type of interrogation signal to be transmitted from among at least two different types of signals. The generator for generating a signal to be amplified is configured so as to allow transmission of a signal to be amplified, so as to generate the interrogation signal corresponding to the selected type of interrogation signal.

It is thus possible to obtain an equipment with a dual-frequency chain. The selection block is designed to select the type of interrogation signal to be transmitted. This selection is for example an automatic selection in the form of a management of priorities between TCAS functionalities and the IFF responder. The rapid switching from one frequency to another and the management of priorities, notably by way of software, between these TCAS functionalities and the IFF responder make it possible to comply with all of the normative constraints with a single transmission chain.

In one particular embodiment, according to a first type of interrogation signal to be transmitted, the generator for generating a signal to be amplified is configured as a Mode S transponder for transmitting a 1090 MHz interrogation signal.

An aeronautical transponder interrogation mode is the format adopted by a series of pulses transmitted by a secondary radar or an equivalent system, and the format, or code, of the response from this transponder. This interrogation mode is used to obtain information about aircraft equipped with the system. In its simplest form, a mode is generally defined by the spacing between two or more interrogation pulses. There are various modes, 1 to 5 for military and A, B, C, D and Mode S for civilian use. Mode S returns various formats of information upon a selective interrogation. Each aircraft is assigned a fixed address coded on 24 bits.

In one particular embodiment, according to a second type of interrogation signal to be transmitted, the generator for generating a signal to be amplified is configured as a traffic alert and collision avoidance system for transmitting a 1030 MHz interrogation signal.

The system using a TCAS signal is an interrogation-based and cooperative system that queries the transponders of nearby aircraft. The TCAS system interrogates all the aircraft within its detection area roughly every second. Depending on the responses, the TCAS system is capable of determining the position thereof in two or three dimensions.

In one particular embodiment, the generator for generating a signal to be amplified comprises a pre-distortion device for pre-distorting the pulses of the signal to be amplified on a carrier frequency.

It is the combination of the pre-distortion of the signal in terms of amplitude and of the modulation of the bias voltage of a second-to-last transistor (pulse shaping) that makes it possible to control both the temporal aspect and the spectral mask of the pulsed signal on the same transmission chain both at the IFF responder frequency and at the IFF/TCAS interrogator transmission frequency.

In one particular embodiment, the pre-distortion device comprises a programmable logic circuit designed to drive an adjustment of a phase and an amplitude of the signal to be amplified, a digital-to-analogue converter for the digital-to-analogue conversion of an IQ signal, and a modulator for modulating the IQ signal with an integrated synthesizer.

In one particular embodiment, the programmable logic circuit comprises a control module designed to control the pre-distortion, a pre-distortion command module, and an amplitude and phase adjustment module.

In one particular embodiment, the control module performs control based on a plurality of parameters such as a frequency, a power and/or a temperature.

Another subject of the invention relates to a method for the radio transmission of an interrogation signal based on a signal to be amplified, said interrogation signal comprising a plurality of pulses. The method comprises a step of generating a signal to be amplified, a step of amplifying the power of the signal to be amplified so as to form an interrogation signal, and a step of generating a trapezoidal signal applied as bias voltage during the power amplification step so as to transmit each of the pulses of said interrogation signal. The radio transmission method comprises a step of selecting a type of interrogation signal to be transmitted from among at least two different types of signals, the step of amplifying the power of the signal to be amplified being configured so as to allow transmission of a signal to be amplified so as to generate the interrogation signal corresponding to the selected type of interrogation signal.

In one particular embodiment, the step of generating the signal to be amplified comprises a step of pre-distorting the pulses of the signal to be amplified on a carrier frequency.

Another subject of the invention relates to a transponder comprising a radio transmission device according to one of the preceding subjects.

Another subject of the invention relates to an ACAS-X comprising a radio transmission device according to one of the preceding subjects.

Another subject of the invention relates to a computer program comprising program instructions able to be utilized by a radio transmission device designed to transmit an interrogation signal based on a signal to be amplified according to one of the preceding subjects, which instructions, when they are executed or interpreted by said transmission device, trigger the implementation of the method for the radio transmission of the interrogation signal according to one of the preceding subjects.

BRIEF DESCRIPTION OF THE DRAWINGS

The present invention will be better understood upon reading the detailed description of embodiments, taken by way of completely non-limiting example and illustrated by the appended drawings, in which.

In the various figures, elements that are identical or similar bear the same references.

DETAILED DESCRIPTION

Figure 1:
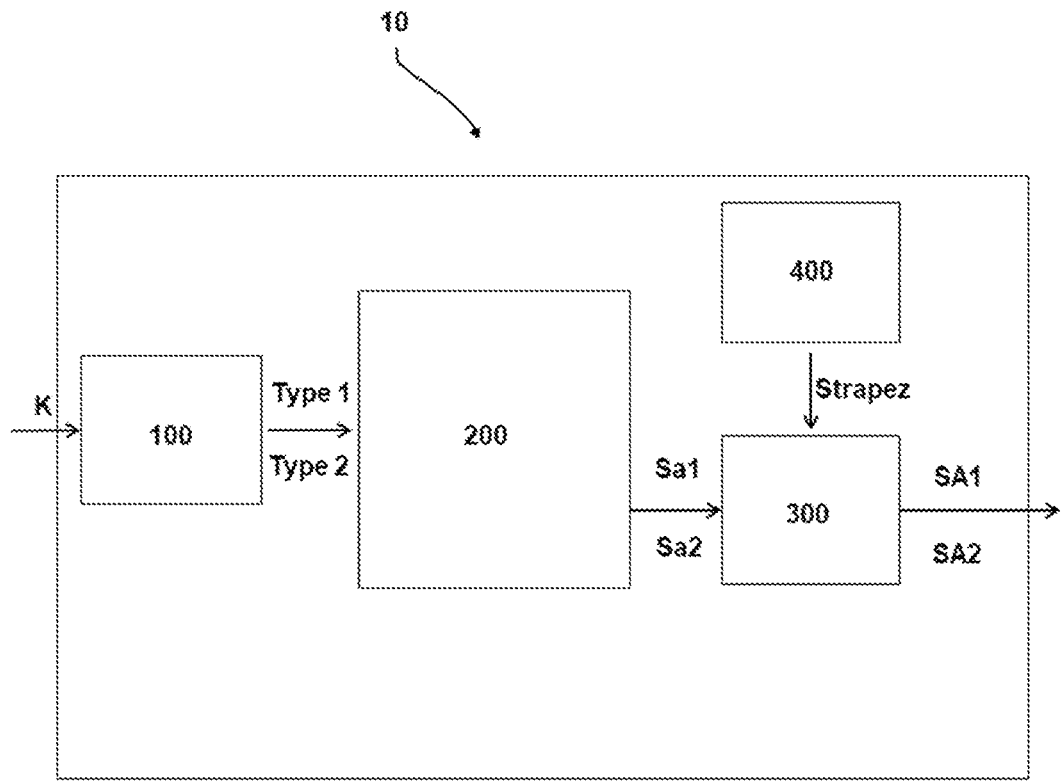
FIG. 1 is a schematic view of a radio transmission device for the radio transmission of an interrogation signal according to the invention.

FIG. 1 illustrates a radio transmission device 10 for the radio transmission of an interrogation signal according to the invention.

This radio transmission device 10 comprises:
a selection block 100;
a generator 200
a power amplification chain 300;
an interface module 400.

The selection block 100 is able to receive a command K. Based on this command K, the selection block 100 provides information about the type of signal Type 1, Type 2 to be transmitted.

The generator 200 is able to receive information about the type of signal Type 1 or Type 2 to be transmitted, and to deliver a signal to be amplified Sa1 or Sa2. The signal to be amplified Sa1 is associated with the type of signal Type 1, and the signal to be amplified Sa2 is associated with the type of signal Type 2.

The power amplification chain 300 is designed to amplify the signal to be amplified Sa1 or Sa2 with a view to forming an interrogation signal SA1 or SA2. The interrogation signal SA1 is associated with the signal to be amplified Sa1 and the interrogation signal SA2 is associated with the signal to be amplified Sa2. This amplification chain comprises at least two transistors (not shown in FIG. 1). The signal is thus amplified by multiple successive amplification stages in order to gradually increase the amplitude and the power of the pulses without introducing noise therein.

The interface module 400 is designed to generate a trapezoidal signal Strapez intended to be applied as bias voltage in the power amplification chain 300 in order to transmit each of the pulses of the interrogation signal SA1, SA2. In one particular embodiment, not shown in FIG. 1, this interface module 400 comprises two gate control signal generation blocks designed to implement an adaptive gain, and a pulse shaping generation block designed to generate the trapezoidal signal Strapez so as to allow an adaptive gain and adaptive signal edges. The interface module 400 makes it possible to use pulse shaping, that is to say to vary the bias voltage of one of the amplifiers of the transmission chain over the periods corresponding to the rising and falling edges of the pulses, so as to shape them so that they comply with a spectral mask and associated RF performance (rise and fall time, inter-pulse noise, compliance with ITU regulations for a wave train as a function of each frequency, power and temperature).

It will be noted that, from now on, the radio transmission device 10 here is either configured as a Mode S transponder for transmitting a 1090 MHz interrogation signal SA1 or configured as a traffic alert and collision avoidance system for transmitting a 1030 MHz interrogation signal SA2.

Figure 2:
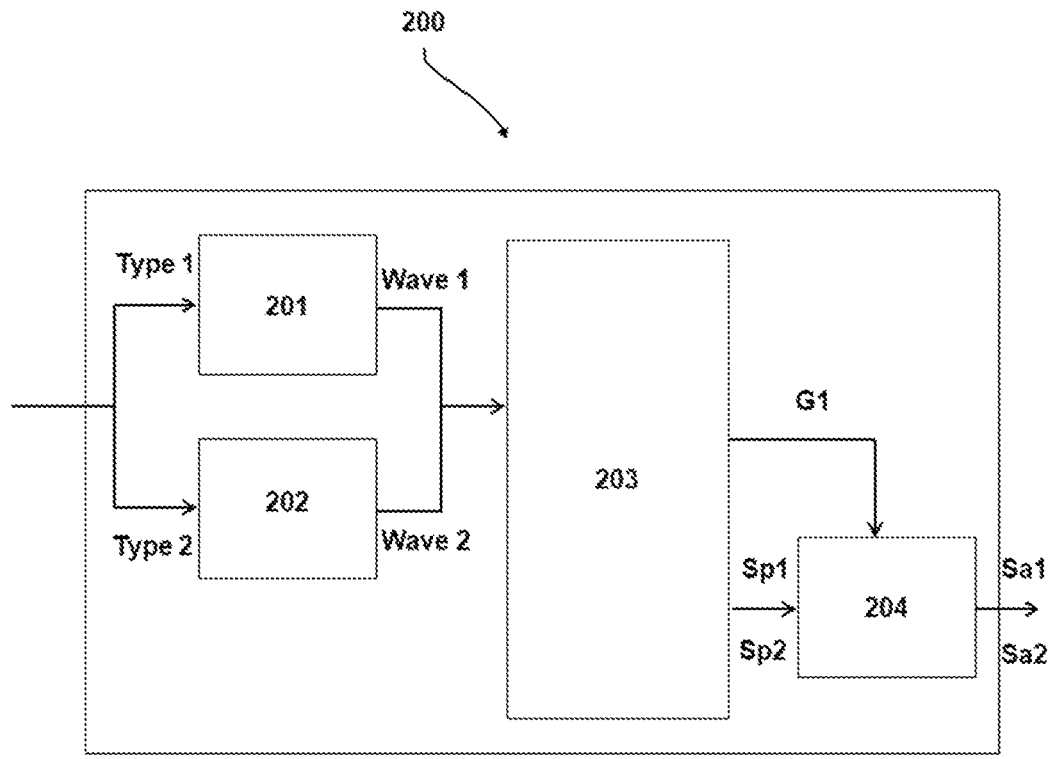
FIG. 2 is a detailed schematic view of a generator for generating a signal to be amplified of the radio transmission device of FIG. 1.

FIG. 2 illustrates the generator 200 of FIG. 1 in more detail.

This generator 200 comprises:
an IFF wave shaping block 201;
a TCAS wave shaping block 202;
a pre-distortion device 203;
an RF amplifier 204.

The block 201 is designed to shape a wave characterizing an IFF transponder. This block 201 receives the information of the signal Type 1 and transmits an associated waveform Wave1.

The block 202 is designed to shape a wave characterizing a TCAS system with specific patterns (whisper/shout function) having different amplitudes on pulses that are spaced by a microsecond. The block 302 receives the information of the signal Type 2 and transmits an associated waveform Wave2.

The device 203 is designed to pre-distort the pulses of the signal to be amplified on the carrier frequency. The successive amplification stages have the effect of deforming the signal. In particular, they tend to redress the edges of the pulses, this having the effect of degrading the spectrum of the transmitted signal. The pre-distortion block 203 makes it possible to keep the transmissions within the desired spectral mask and temporal mask. The block 203 is designed to receive the waveform Wave1 or the waveform Wave2. At output, the block 203 delivers a first signal Sp1 that has undergone pre-distortion on the waveform Wave1 or a second signal Sp2 that has undergone pre-distortion on the waveform Wave2. The block 203 also delivers an adaptive gain G1.

The RF amplifier 204 is designed to amplify the first signal Sp1 or the second signal Sp2 based on the adaptive gain G1. The amplification by the RF amplifier 204 is insufficient. This RF amplifier 204 will then deliver a first signal to be amplified Sa1 or a second signal to be amplified Sa2 to the power amplification chain 300 of FIG. 1.

Figure 3:
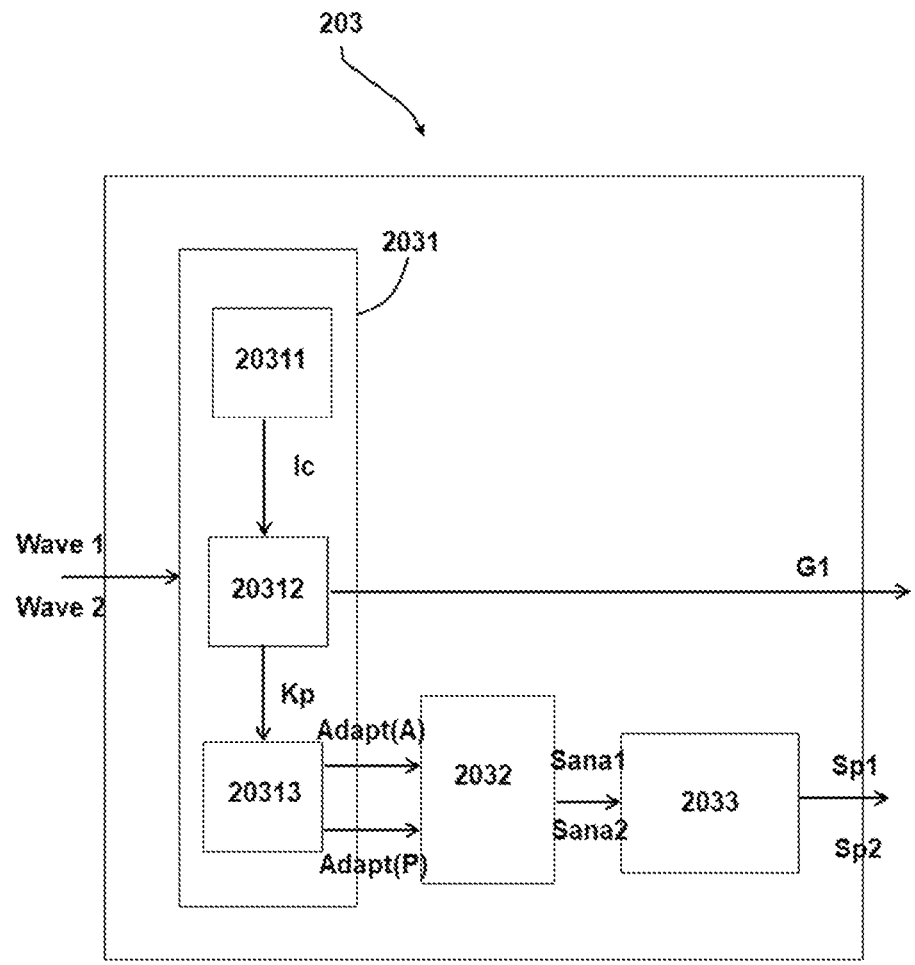
FIG. 3 is a detailed schematic view of a pre-distortion device of the generator for generating a signal to be amplified of FIG. 2.
Figure 4:
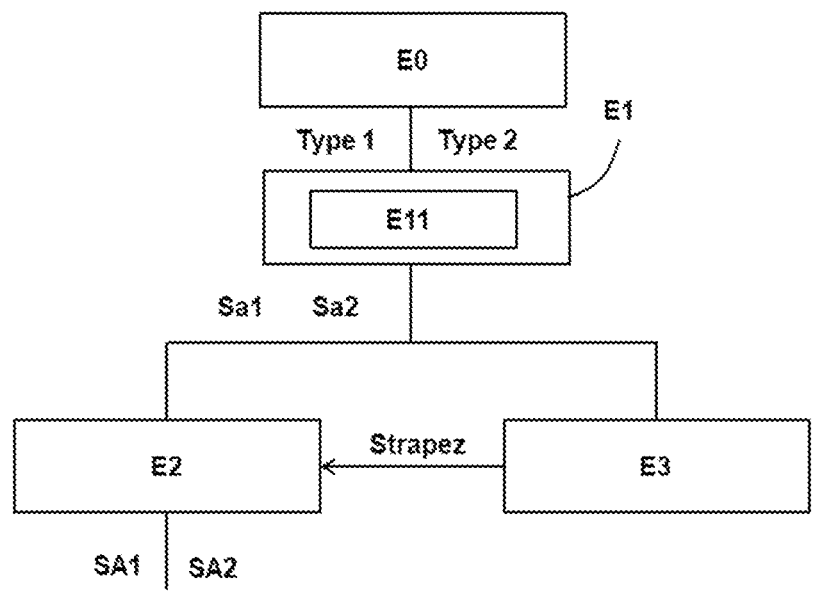
FIG. 4 illustrates the steps of a method for the radio transmission of an interrogation signal according to the invention.

FIG. 3 details the pre-distortion device 203. This device 203 comprises:
a programmable logic circuit 2031;
a digital-to-analogue converter 2032;
a modulator 2033.

The programmable logic circuit 2031 is able to drive an adjustment of a phase and an amplitude of the signal to be amplified. It receives the waveform Wave1 or the waveform Wave2 delivered by the block 201 or the block 202. This programmable logic circuit 2031 comprises:
a control module 20311 designed to control the pre-distortion;
a pre-distortion command module 20312;
an adjustment module 20313.

The control module 20311 is designed to control the pre-distortion. This control is performed based on a plurality of parameters such as a frequency, a power and/or a temperature. The control module 20311 transmits control information Ic to the pre-distortion command module 20312.

The pre-distortion command module 20312 is designed to generate the active gain G1 and a pre-distortion command Kp for the amplitude and phase adjustment module 20313. In one particular embodiment, not illustrated in FIG. 3, the command module 20312 comprises an oscillator selection block and an adaptive gain block. The oscillator selection block is able to select an oscillation frequency at two different frequencies, that is to say in this case at the frequency 1090 MHz or the frequency 1030 MHz. This oscillation choice is linked to the received waveform Wave1 or Wave2.

The adjustment module 20313 is designed to adjust the amplitude and the phase of the received waveform Wave1 or of the received waveform Wave2 based on the received pre-distortion command Kp. This adjustment module 20313 then delivers an amplitude adjustment Adapt(A) or a phase adjustment Adapt(P).

The digital-to-analogue converter 2032 is designed to convert an IQ signal into baseband or to an intermediate frequency. It receives the amplitude adjustment and the phase adjustment from the adjustment module 20313. This converter makes it possible to convert the pre-distortion into an analogue signal. This pre-distortion is necessary for guaranteeing the amplitude differences between pulses of one and the same train (a few hundred nanoseconds between pulses) in accordance with the standards. This digital-to-analogue converter 2032 is designed to transmit a first analogue signal Sana1 or a second analogue signal Sana2 in accordance with the waveform Wave1 or Wave2 with an adjusted amplitude and phase.

The modulator 2033 is designed to modulate the IQ signal with an integrated synthesizer. More particularly, this modulator 2033 uses a preprogrammed bank to generate the transmission frequency to be frequency-switched in a few microseconds. This module 2033 receives the first analogue signal Sana1 or Sana2 and transmits the first signal Sp1 or the second signal Sp2 at output.

A method for the radio transmission of an interrogation signal will be described with reference to FIGS. 1 to 3 and FIG. 4.

This radio transmission method comprises a step E1 of generating a signal to be amplified Sa1, Sa2. In a sub-step E11 of generation step E1, the pre-distortion is performed for pulses of the signal to be amplified Sa1, Sa2 on the carrier frequency.

The signal Sa1, Sa2 is then amplified in a power amplification step E2 so as to form the interrogation signal SA1, SA2.

In a step E3, the trapezoidal signal Strapez is applied as bias voltage during power amplification step E2.

In a step E0 prior to steps E1 to E3, a type of interrogation signal to be transmitted is selected from among at least two different types of signals. Step E2 of amplifying the power of the signal to be amplified is thus configured so as to allow transmission of the signal to be amplified Sa1, Sa2 so as to generate the interrogation signal SA1, SA2 corresponding to the selected type Type 1, Type 2 of interrogation signal.

The radio device 10 affords the following advantages:
it makes it possible to use a single transmission chain for both frequencies rather than two to provide the responder and TCAS functions;
it makes it possible to divide the number of antennas required by two, thereby reducing weight, volume and consumption;
it makes it possible to use pre-distortion on the IQ inputs rather than switching to an attenuator to implement the whisper/shout function;
it makes it possible to use digital pulse shaping instead of power filtering so as to comply with a spectral mask on a single channel;
it makes it possible to manage the various TCAS transmission levels by controlling the gains of the first stages of the amplification chain by programming the components between the trains (typically 1 ms).

The invention also relates to a transponder comprising the radio transmission device 10 or an airborne collision avoidance system X (ACAS-X) comprising such a transmission device 10.

The invention also relates to a computer program product comprising program instructions able to be utilized by the radio transmission device designed to transmit the interrogation signal SA1, SA2 based on the signal to be amplified Sa1, Sa2, which instructions, when they are executed or interpreted by said transmission device 10, trigger the implementation of the method for the radio transmission of the interrogation signal SA1, SA2.

The invention is not limited to the embodiments and variants that are presented, and other embodiments and variants will be readily apparent to those skilled in the art.

The invention claimed is:

1. A radio transmission device for the radio transmission of an interrogation signal based on a signal to be amplified, said interrogation signal comprising a plurality of pulses, said radio transmission device comprising:
a generator for generating the signal to be amplified, said generator comprising a pre-distortion device for pre-distorting the pulses of the signal to be amplified on a carrier frequency;
a single power amplification chain for amplifying the power of the signal to be amplified so as to form the interrogation signal;
an interface module able to generate a trapezoidal signal applied as bias voltage in the power amplification chain so as to transmit each of the plurality of pulses of the interrogation signal;
wherein said radio transmission device comprises a selection block for selecting an interrogation signal type from among at least two different interrogation signal types, said generator for generating the signal to be amplified being configured so as to allow transmission of the signal to be amplified, so as to generate the interrogation signal corresponding to the selected interrogation signal type.

2. The transmission device according to claim 1, wherein, according to a first interrogation signal type, the radio transmission device is configured as a Mode S transponder for transmitting a 1090 MHz interrogation signal.

3. The transmission device according to claim 1, wherein, according to a second interrogation signal type, the radio transmission device is configured as a traffic alert and collision avoidance system for transmitting a 1030 MHz interrogation signal.

4. The transmission device according to claim 1, wherein the pre-distortion device comprises:
a programmable logic circuit able to drive an adjustment of a phase and an amplitude of the signal to be amplified,
a digital-to-analogue converter for the digital-to-analogue conversion of an IQ signal;
a modulator for modulating the IQ signal with an integrated synthesizer.

5. The transmission device according to claim 4, wherein the programmable logic circuit comprises:
a control module designed to control the pre-distortion;
a pre-distortion command module;
an amplitude and phase adjustment module.

6. The transmission device according to claim 5, wherein the control module performs control based on a plurality of parameters such as a frequency, a power and/or a temperature.

7. A method for the radio transmission of an interrogation signal based on a signal to be amplified in a radio transmission device comprising a single amplification chain, the interrogation signal comprising a plurality of pulses, said method comprising:
a step of generating the signal to be amplified, and to apply a pre-distortion to pulses of the signal to be amplified;
a step of amplifying the power of the signal to be amplified so as to form the interrogation signal;
a step of generating a trapezoidal signal applied as bias voltage during the power amplification step so as to transmit each of the pulses of the interrogation signal;
wherein said radio transmission method comprises:
a step of selecting an interrogation signal type from among at least two different interrogation signal types, the step of amplifying the power of the signal to be amplified being configured so as to allow transmission of the signal to be amplified so as to generate the interrogation signal corresponding to the selected interrogation signal type.

8. The transmission method according to claim 7, wherein the step of generating the signal to be amplified comprises a step of pre-distorting the pulses of the signal to be amplified on a carrier frequency.

9. A transponder comprising a radio transmission device according to claim 1.

10. An ACAS-X comprising a radio transmission device according to claim 1.

11. A non-transitory computer-readable medium storing instructions that, when executed by the radio transmission device of claim 1, cause performance of a method for radio transmission of the interrogation signal based on the signal to be amplified, said method comprising:

a step of generating the signal to be amplified and applying a pre-distortion to pulses of the signal to be amplified;

a step of amplifying the power of the signal to be amplified so as to form the interrogation signal;

a step of generating the trapezoidal signal applied as the bias voltage during the power amplification step so as to transmit each of the pulses of the interrogation signal;

wherein said radio transmission method comprises:

a step of selecting the interrogation signal type from among the at least two different interrogation signal types of signals, the step of amplifying the power of the signal to be amplified being configured so as to allow transmission of the signal to be amplified so as to generate the interrogation signal corresponding to the selected interrogation signal type.

\* \* \* \* \*

UNITED STATES PATENT AND TRADEMARK OFFICE
CERTIFICATE OF CORRECTION

| | | |
|---|---|---|
| PATENT NO. | : 11,848,813 B2 | Page 1 of 1 |
| APPLICATION NO. | : 17/558245 | |
| DATED | : December 19, 2023 | |
| INVENTOR(S) | : Laure Hogommat-Chabrot et al. | |

It is certified that error appears in the above-identified patent and that said Letters Patent is hereby corrected as shown below:

In the Claims

In Claim 11, Column 9, Line 13, "different interrogation signal types of signals," should be
-- different interrogation signal types, --.

Signed and Sealed this
First Day of October, 2024

Katherine Kelly Vidal
*Director of the United States Patent and Trademark Office*